(12) United States Patent
Smith et al.

(10) Patent No.: US 6,589,819 B2
(45) Date of Patent: Jul. 8, 2003

(54) MICROELECTRONIC PACKAGES HAVING AN ARRAY OF RESILIENT LEADS AND METHODS THEREFOR

(75) Inventors: John W. Smith, Horseshoe Bay, TX (US); Bruce McWilliams, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/955,695

(22) Filed: Sep. 19, 2001

(65) Prior Publication Data

US 2002/0145182 A1 Oct. 10, 2002

Related U.S. Application Data

(60) Provisional application No. 60/236,395, filed on Sep. 29, 2000.

(51) Int. Cl.[7] .......................... H01L 21/44; H01L 21/48; H01L 21/50
(52) U.S. Cl. ...................................................... 438/123
(58) Field of Search ........................ 257/674, 669–673, 257/767–773; 438/121–123

(56) References Cited

U.S. PATENT DOCUMENTS

| | | | |
|---|---|---|---|
| 5,148,265 A | 9/1992 | Khandros et al. | 357/80 |
| 5,148,266 A | 9/1992 | Khandros et al. | 357/80 |
| 5,455,390 A | 10/1995 | DiStefano et al. | 174/262 |
| 5,518,964 A | 5/1996 | DiStefano et al. | 437/209 |
| 5,763,941 A | 6/1998 | Fjelstad | 257/669 |
| 5,801,441 A | 9/1998 | DiStefano et al. | 257/696 |
| 5,859,472 A | 1/1999 | DiStefano et al. | 257/674 |
| 5,976,913 A | 11/1999 | Distefano | 438/113 |
| 6,117,694 A | 9/2000 | Smith et al. | 438/14 |
| 6,191,368 B1 | 2/2001 | Di Stefano et al. | 174/260 |

*Primary Examiner*—Cuong Quang Nguyen
(74) *Attorney, Agent, or Firm*—Lerner, David, Littenberg, Krumholz & Mentlik, LLP

(57) ABSTRACT

A method of making a microelectronic package having an array of resilient leads includes providing a first element having a plurality of conductive leads at a first surface thereof, the conductive leads having terminal ends permanently attached to the first element and tip ends remote from the terminal ends, the tip ends being movable relative to the terminal ends. A second element having a plurality of contacts on a first surface thereof is then juxtaposed with the first surface of the first element, and the tip ends of the conductive leads are connected with the contacts of the second microelectronic element. The first and second elements are then moved away from one another so as to vertically extend the conductive leads between the first and second elements. After the moving step, a layer of a spring-like conductive material is formed over the conductive leads to form composite leads. The layer of a spring-like material desirably has greater yield strength than the conductive leads, thereby enhancing the resiliency of the composite lead structure.

43 Claims, 12 Drawing Sheets

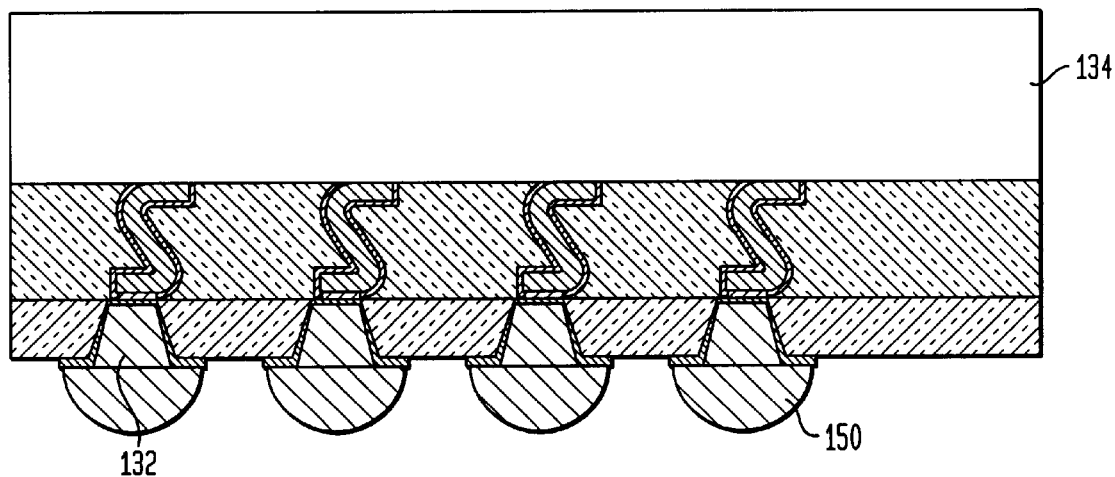
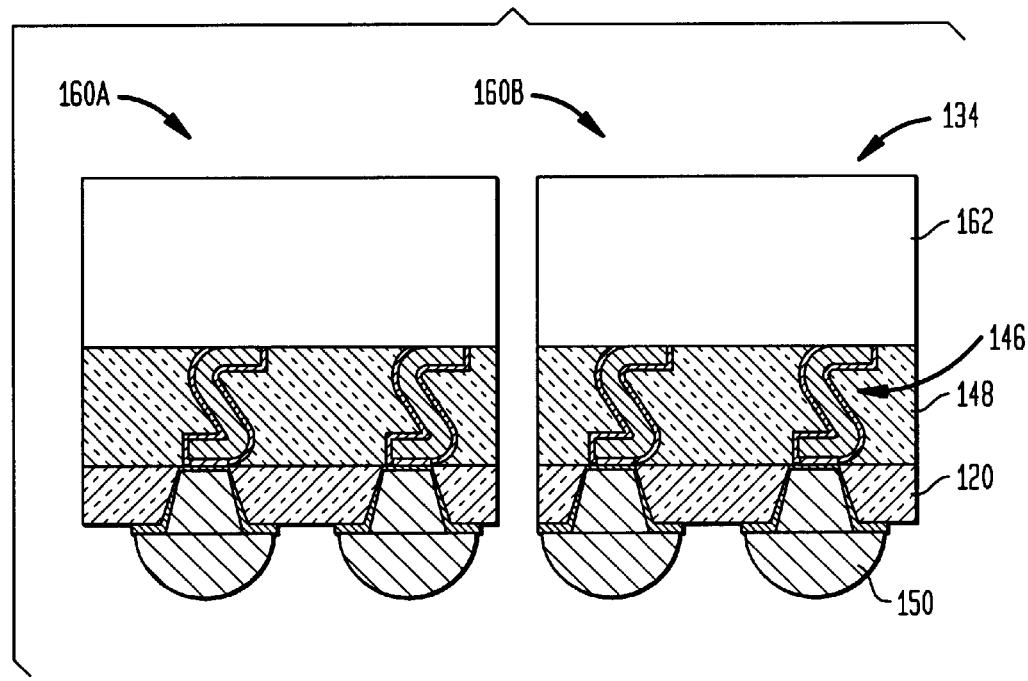

MICROELECTRONIC PACKAGES HAVING AN ARRAY OF RESILIENT LEADS AND METHODS THEREFOR

CROSS-REFERENCE TO RELATED APPLICATIONS

The present application claims benefit of U.S. Provisional Application No. 60/236,395, filed Sep. 29, 2000, the disclosure of which is hereby incorporated by reference herein.

FIELD OF THE INVENTION

The present invention relates to microelectronic packages having leads or traces and specifically relates to microelectronic packages having arrays of resilient leads and methods of making such microelectronic packages.

BACKGROUND OF THE INVENTION

Complex microelectronic devices such as semiconductor chips typically require numerous connections to other electronic components. For example, a complex device including a semiconductor chip may require hundreds of electrical connections between the chip and one or more external devices. These electrical connections may be made using several alternative methods, including wire bonding, tape automated bonding and flip-chip bonding. Each of these techniques presents various problems including difficulty in testing the chip after bonding, long lead lengths, large areas occupied by the chip on a microelectronic assembly, and fatigue of the connections due to changes in size of the chip and the substrate during thermal expansion and contraction.

In many microelectronic devices, it is desirable to provide an electrical connection between components that can accommodate relative movement between the components. For example, where a semiconductor chip is mounted to a circuit board, thermal expansion and contraction of the chip and circuit board can cause the contacts on the chip to move relative to contacts on the circuit board. This movement can occur during operation of the device and can also occur during manufacturing operations (e.g. when soldering the chip to the circuit board).

One structure that has been used to successfully address these problems is commonly referred to as an "interposer" or "chip carrier", such as that shown in certain preferred embodiments of commonly assigned U.S. Pat. Nos. 5,148,265, 5,148,266 and 5,455,390, the disclosures of which are hereby incorporated by reference herein. Interposers typically include a flexible, sheet-like element having a plurality of terminals disposed thereon, and including flexible leads used to connect the terminals with contacts on a microelectronic element, such as a semiconductor chip or wafer. The flexible leads permit thermal expansion of the various components without inducing stresses in the connection. The terminals of the interposer may then be used to test the assembly, and/or permanently attach the assembly to another microelectronic element.

A compliant layer may be disposed between a microelectronic element and the interposer. The compliant layer typically encapsulates the leads connecting the interposer and microelectronic element and facilitates connection of the terminals to a test device and/or to the final electronic assembly by compensating for variations in component flatness and terminal heights.

As illustrated in certain preferred embodiments of commonly assigned U.S. Pat. No. 5,518,964 ("the '964 patent"), the disclosure of which is hereby incorporated by reference herein, an array of moveable electrical connections between two microelectronic elements, such as a semiconductor chip and a substrate, can be provided by first connecting leads between the microelectronic elements and then moving the elements away from one another through a predetermined displacement so as to bend the leads. One of the microelectronic elements may be a connection component including a dielectric body having leads extending along a surface of the dielectric body. The leads may have first ends permanently attached to the dielectric body and second ends releasably attached to the dielectric body. The dielectric body, with the leads thereon, may be juxtaposed with a semiconductor chip having contacts and the second releasable ends of the leads may be bonded to the contacts on the chip. Following bonding, the dielectric body and chip are moved away from one another, thereby bending the leads toward a vertically extensive disposition. During or after movement, a curable material such as a liquid composition may be introduced between the elements. The curable material may then be cured, such as by using heat, to form a compliant dielectric layer surrounding the leads. The resulting semiconductor chip package has terminals on the dielectric body or connection component which are electrically connected to the contacts on the chip, but which can move relative to the chip so as to compensate for thermal effects. For example, the semiconductor chip package may be mounted to a circuit board by solder-bonding the terminals to conductive pads on the circuit board. Relative movement between the circuit board and the chip due to thermal effects is allowed by the moveable interconnection provided by the leads and the compliant layer.

In other embodiments of the '964 patent, the package-forming process can be conducted on a wafer scale, so that all of the semiconductor chips in a wafer may be connected to connection components in a single step. The resulting wafer package is then severed so as to provide individual units, each including one or more of the chips and a portion of the dielectric body. The above-described leads may be formed on the chip or wafer, rather than on the dielectric body. In further embodiments of the '964 patent, a dielectric body having terminals and leads is connected to terminal structures on a temporary sheet. The temporary sheet and dielectric body are moved away from one another so as to vertically extend the leads, and a curable liquid material is introduced around the leads and cured so as to form a compliant layer between the temporary sheet and the dielectric body. The temporary sheet is then removed, leaving the tip ends of the terminal structures projecting from a surface of the compliant layer. Such a component, commonly referred to as a connection component, may be used between two other components. For example, the terminal structures may be engaged with a semiconductor chip and the terminals engaged with a circuit panel or other microelectronic component.

In certain preferred embodiments of commonly assigned U.S. Pat. No. 6,117,694, the disclosure of which is hereby incorporated herein by reference, a microelectronic component, such as a connector or a packaged semiconductor device, is made by connecting multiple leads between a pair of elements and moving the elements away from one another so as to bend the leads toward a vertically extensive disposition. One of the elements may include a temporary support that may be removed after bending the leads After the leads interconnect the microelectronic elements, an encapsulant, such as a flowable, curable dielectric material, may be injected between the microelectronic elements. The encapsulant may be injected between the micro-
} electronic elements immediately after bonding, whereby the force of the pressurized encapsulant acting on the elements separates them and bends the leads, forming a compliant lead configuration. Alternatively, the leads may be formed before injecting the encapsulant by retaining the elements against moveable platens by vacuum, and moving the platens with respect to each other, bending and forming the leads. The encapsulant is then injected while the dielectric sheet and the wafer are in their displaced positions.

After the flowable, curable dielectric material has been cured, the microelectronic assembly may be removed from the fixture, trimmed and tested. The fixture may then be reused to perform the above operations on the next microelectronic assembly.

Despite these and other advances in the art, still further improvements would be desirable.

SUMMARY OF THE INVENTION

In accordance with certain preferred embodiments of the present invention, a method of making a microelectronic package having an array of resilient leads includes providing a first element having a plurality of conductive leads on a first surface thereof. The conductive leads preferably have terminals ends permanently attached to the first element and tip ends remote from the terminal ends, the tip ends of the conductive leads being movable relative to the terminal ends. The method preferably includes providing a second element having a plurality of contacts on a first surface thereof and juxtaposing the first surface of the second element with the first surface of the first element. The tip ends of the conductive leads may then be connected with the contacts of the second microelectronic element. The first and second microelectronic elements may then be moved away from one another so as to vertically extend the conductive lead between the first and second microelectronic elements. After the moving step, a layer of a spring-like material may then be formed over the conductive leads. The layer of a spring-like material preferably has greater yield strength than the conductive leads. Although the present invention is not limited by any particular theory of operation, it is believed that providing a layer of a spring-like material having greater yield strength then the yield strength of the conductive leads produces a highly resilient composite lead able to withstand substantial flexing and bending. As used herein, the term "composite lead" means a conductive lead or trace having a core made of a first conductive material that is coated by a shell of a second conductive material.

The conductive leads may be made of a material selected from the group consisting of aluminum, gold, copper, tin, and their alloys and combinations thereof. The layer of a spring-like material formed over the conductive leads is preferably selected from the group consisting of nickel, copper, cobalt, iron, gold, silver, platinum, noble metals, semi-noble metals, tungsten, molybdenum, tin, leads, bismuth, indium, their alloys, and combinations thereof.

In certain preferred embodiments, the method includes depositing a curable liquid encapsulant between the first and second microelectronic elements and around the vertically extended composite leads. In preferred embodiments, the curable liquid encapsulant is selected from the group consisting of materials that are curable to elastomers and adhesives. The preferred elastomers and adhesives are selected from the group consisting of silicones and epoxies. In highly preferred embodiments, the curable liquid encapsulant is a composition which is curable to a silicone elastomer. After the curable liquid encapsulant is deposited, the encapsulant may be cured to provide a compliant layer between the first and second microelectronic elements and around the vertically extended leads. In preferred embodiments, the terminals are accessible at the second surface of the second microelectronic element. Conductive elements, such as solder balls, may then be attached to the terminals ends of the leads. The conductive elements may be fusible masses of conductive metal, such as tin/lead solder balls.

In preferred embodiments, the first element and/or the second element is a microelectronic element. In preferred embodiments, the microelectronic elements are selected from the group consisting of a semiconductor chips, semiconductor wafers, packaged semiconductor chips or wafers, dielectric sheets, flexible substrates, flexible circuitized substrates, printed circuit boards, and sacrificial layers. In more preferred embodiments, the first and second microelectronic elements are selected from the group consisting of semiconductor chips, semiconductor wafers, and flexible substrates. In particularly preferred embodiments, the first microelectronic element is a chip and the second microelectronic element is a flexible substrate. In certain embodiments, at least one of the microelectronic elements may be a sacrificial layer. The sacrificial layer may be removed during one step of an assembly process so as to expose either the terminal ends or the tip ends of the conductive leads. In an alternative embodiment, the sacrificial layer may be conductive and the terminal ends or the tips ends of the conductive leads may be formed and/or exposed by removing a portion of the conductive sacrificial layer.

In other embodiments, a method of making a microelectronic package having a plurality of resilient leads includes providing a first microelectronic element having conductive leads extending along a first surface thereof, the conductive leads having terminal ends permanently attached to the first microelectronic element and tip ends releasably secured to the first microelectronic element. A second microelectronic element having contacts on a first surface thereof, may then be juxtaposed with the first surface of the first microelectronic element and the tip ends of the conductive leads may be connected with the contacts of the second microelectronic element. The first and second microelectronic elements may then be moved away from one another so as to vertically extend the conductive leads between the first and second microelectronic elements. In certain preferred embodiments, the tip ends of the conductive leads may be releasably secured to the first microelectronic element. After the moving step, a layer of a spring-like material may be formed over the conductive leads. The layer of a spring-like material may be formed by plating a conductive metal over the conductive leads. The conductive metal plated over the conductive leads preferably has a higher yield strength than the conductive leads. A curable liquid encapsulant may then be disposed between the first and second microelectronic elements and around the conductive leads. The curable liquid encapsulant may be cured to form a compliant layer between the microelectronic elements and around the leads.

In still other preferred embodiments of the present invention, a method of making a microelectronic package includes providing a first microelectronic element having a first surface with a plurality of conductive leads formed thereon, each lead having a first end permanently attached to the first microelectronic element and a second end movable away from the first microelectronic element. A second microelectronic element having conductive pads accessible at a first surface thereof may then be provided and the first surface of the first microelectronic element may be juxtaposed with the first surface of the second microelectronic element. The method may also include attaching the second ends of the conductive leads with the conductive pads or contacts of the second microelectronic element. After the attaching step, the first and second microelectronic elements may be moved away from one another so as to vertically extend the conductive leads. After the moving step, a layer of a conductive metal may be formed over the conductive leads, the layer of a conductive metal having a greater yield strength then the conductive leads.

In certain preferred embodiments, the first microelectronic element is a flexible substrate, such as a flexible dielectric sheet, and the second microelectronic element is a semiconductor chip or a semiconductor wafer. In other preferred embodiments, the first microelectronic element is a semiconductor chip or wafer and the second microelectronic element is a flexible substrate such as a flexible dielectric sheet. If the first microelectronic element is a wafer, the method may also include severing the semiconductor wafer and the flexible dielectric sheet to provide a plurality of semiconductor packages, whereby each semiconductor package includes at least one semiconductor chip connected to a portion of the flexible dielectric sheet.

In yet other preferred embodiments of the present invention, a method of making semiconductor packages having resilient leads includes providing a semiconductor chip or wafer having a plurality of contacts on a first surface thereof, and providing a flexible dielectric sheet having a plurality of conductive leads over a first surface thereof, whereby each lead has a terminal end permanently attached to the flexible dielectric sheet and a tip end movable away from the first surface of the dielectric sheet. The tip ends of the leads may then be electrically interconnected with the contacts of the wafer. If a wafer is used, then the wafer and the dielectric sheet may then be moved away from one another in a controlled fashion so as to vertically extend the leads. After the wafer and dielectric sheet are moved away from one another, a layer of a spring-like material may be formed over the outer surface of the conductive leads to form composite leads. The spring-like material desirable has a greater yield strength than the yield strength of the conductive leads. A layer of a compliant material may then be disposed between the wafer and the dielectric sheet and around the composite leads. The wafer and the dielectric sheet may then be severed so as to provide a plurality of semiconductor packages, each semiconductor package including at least one semiconductor chip and a portion of the dielectric sheet.

In further preferred embodiments of the present invention, a method of making a microelectronic element includes providing a dielectric sheet having a plurality of conductive leads overlying the first surface of the sheet and a plurality of terminals accessible at a second surface of the sheet, whereby each lead has a first end permanently attached to one of the terminals and a second end movable away from the first surface of the dielectric sheet. The method includes providing a fixture having a first surface and a plurality of contacts accessible at the first surface of the fixture, juxtaposing the first surface of the fixture with the first surface of the dielectric sheet and attaching the second ends of leads with the contacts of the fixture. After the attaching step, the fixture and the dielectric sheet may be moved away from one another so as to vertically extend the leads. A layer of a conductive spring-like material may then be formed over the exterior surface of the conductive leads to form composite leads, and a layer of a curable liquid encapsulant may be provided between the fixture and the dielectric sheet and around the composite leads. The encapsulant may then be cured to form a compliant layer. After the curing step, the fixture may be removed so as to expose the contacts at a top surface of the package.

In yet other preferred embodiments of the present invention, a connection component includes a flexible substrate having a top surface and a bottom surface, and a layer of a compliant dielectric material overlying the top surface of the substrate, the compliant material having a top surface remote from the substrate. The connection component includes an array of flexible, conductive leads having first ends attached to terminals accessible at the second surface of the said substrate and second ends adjacent the top surface of the compliant layer. Each lead preferably includes a core made of a first conductive material that is surrounded by a layer of a second conductive material. Such leads are similar to the composite leads described above. The second conductive material of the lead preferably has a greater yield strength than the first conductive material. The second ends of the leads may be accessible at the tope surface of the compliant layer. The connection component may also include contacts attached to the second ends of the leads, the contacts being accessible at the top surface of the compliant layer.

These and other preferred embodiments of the present invention will be set forth in further detail below.

BRIEF DESCRIPTION OF THE DRAWINGS

FIGS. 2A–2I show a method of making microelectronic packages having arrays of resilient leads, in accordance with further preferred embodiments of the present invention.

DETAILED DESCRIPTION OF PREFERRED EMBODIMENTS

Figure 1A:
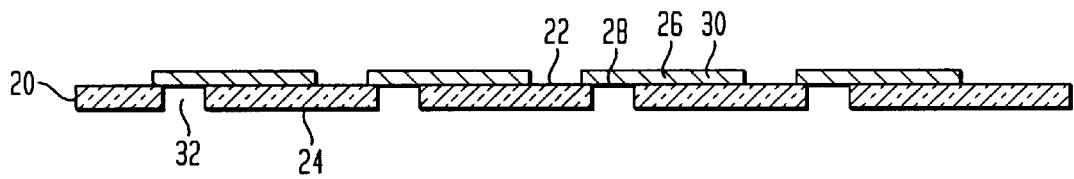
FIGS. 1A–1G show a method of making a microelectronic package having an array of resilient leads, in accordance with one preferred embodiment of the present invention.

Referring to FIG. 1A, a substrate 20 includes a first surface 22 and a second surface 24 remote therefrom. Although substrate 20 may be rigid, semi-rigid or flexible, in preferred embodiments substrate 20 is flexible, such as a flexible dielectric sheet. The flexible substrate 20 includes a plurality of flexible conductive leads 26 formed on the first surface 22 thereof. The flexible conductive leads 26 may be made from a wide variety of materials, including gold, aluminum, copper, their alloys, and combinations thereof. Each conductive lead 26 desirable includes a terminal end 28 permanently secured to flexible substrate 20 and a tip end 30 remote from the terminal end. As will be described in more detail below, the tip ends 30 of the leads 26 are preferably releasably attached to and movable away from the top surface 22 of flexible substrate 20. The terminal end 28 of each lead 26 is preferably aligned with an opening 32 extending between the first and second surfaces 22, 24 of flexible substrate 20. In preferred embodiments, the flexible substrate 20 is comprised of a sheet of a dielectric material, more preferably of a sheet of a polymeric dielectric material. In particularly preferred embodiments, flexible substrate 20 is comprised of a sheet of polyamide.

Figure 1B:
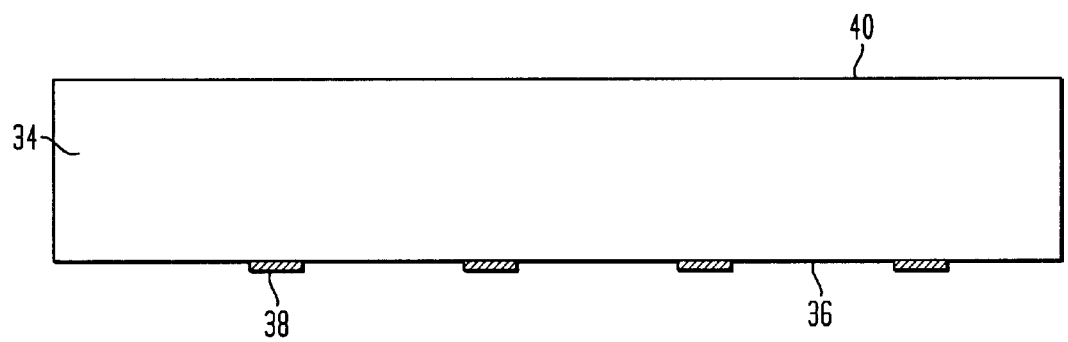

As will be described in more detail below, the flexible substrate 20 is preferably assembled to another microelectronic element. Referring to FIG. 1B, one such microelectronic element is a semiconductor wafer 34 having a contact bearing face 36 including a plurality of contacts 38 formed on the contact bearing face, and a rear face 40 remote from contact bearing face 36. The plurality of contacts 38 are preferably positioned in an array over contact bearing face 36 of wafer 34. When semiconductor wafer 34 is positioned over the first surface 22 of flexible substrate 20, the contacts 38 are preferably placed in substantial alignment with the tip ends 30 of conductive leads 26.

Figure 1C:
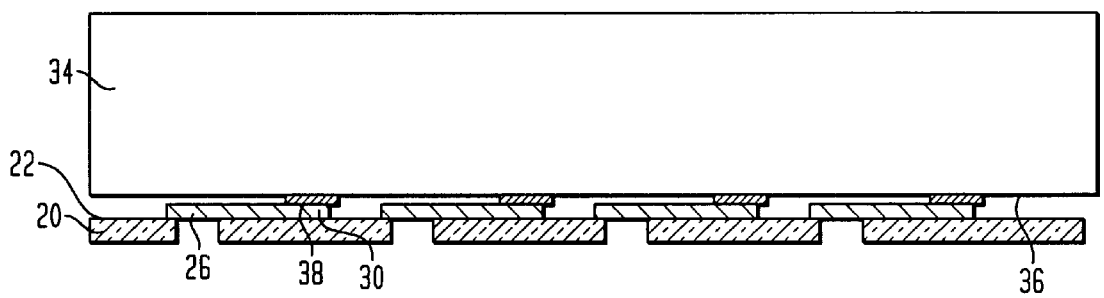

Referring to FIG. 1C, the contact bearing face 36 of semiconductor wafer 34 is then juxtaposed with the first surface 22 of flexible substrate 20 so that contacts 38 are in substantial alignment with tip ends 30 of conductive leads 26. A conductive paste (not shown) may be applied to the tip ends 30 of conductive leads 26 in order to temporarily attach contacts 38 to the tip ends 30. The leads 26 may be permanently attached to contacts 38 by bonding the tip ends 30 of leads 26 to contacts 38.

The tip ends 30 of the conductive leads 26 are preferably peelable or releasable from the first surface 22 of flexible substrate 20. Adhesion between the flexible substrate 20 and the tip ends 30 of leads 26 may be reduced by using the methods disclosed in commonly assigned U.S. Pat. No. 5,763,941; and U.S. patent applications Ser. No. 09/020,750; 09/200,100; 09/225,669; 09/566,273; 09/577,474; 09/317,675; and 09/757,968, the disclosures of which are hereby incorporated by reference herein. For example, prior to forming the conductive leads 26 atop the flexible substrate 20, an adhesion reducing substance such as silicone may be provided over the first surface 22 of substrate 20 for reducing the level of adhesion between tip ends 30 and substrate 20. In the particular embodiment shown in FIGS. 1A–1C, the tip ends 30 of leads 26 are commonly referred to as being releasable and the terminal ends 28 of leads 26 are commonly referred to as being fixed. In embodiments where the substrate is made of a polymeric material, there may be no need to take affirmative steps to enhance peelability between leads 26 and flexible substrate 20 because poor adhesion generally results between leads 26 and polymeric layers.

Figure 1D:
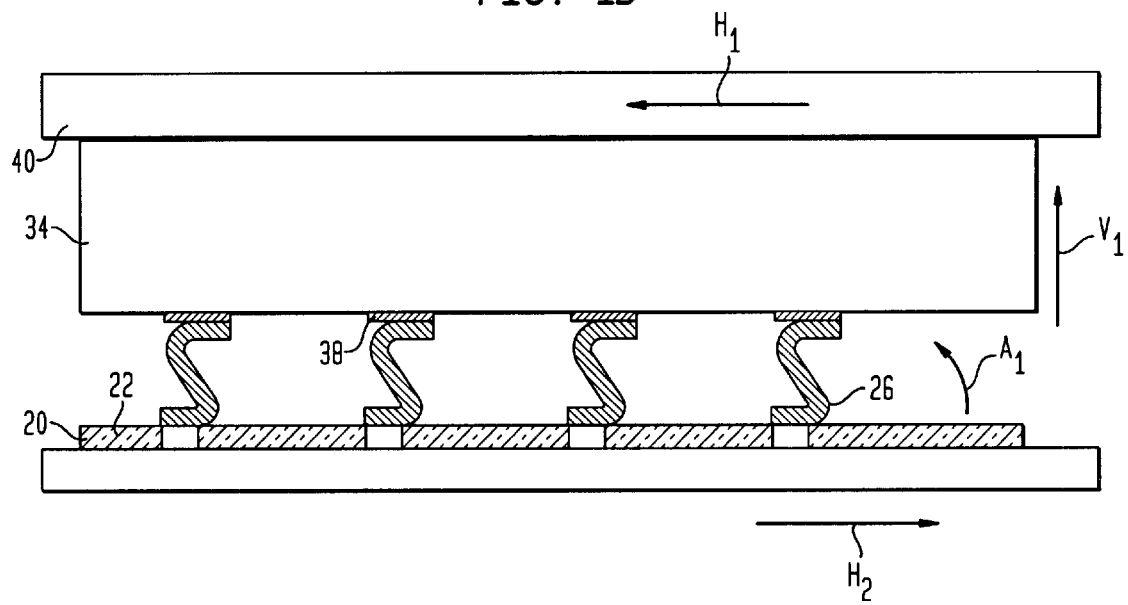

Referring to FIG. 1D, after leads 26 are attached to contacts 38, the semiconductor wafer 34 and the flexible substrate 20 are moved away from one another through a controlled displacement using platens 40, 42 as disclosed in commonly assigned U.S. Pat. No. 5,801,441, the disclosure of which is hereby incorporated by reference herein. A vacuum is preferably applied through platen 40 for firmly holding semiconductor wafer 34 and through platen 42 for firmly holding flexible substrate 20. One or both of the platens are moved so that semiconductor wafer 34 moves vertically away from flexible substrate 20 in the direction indicated by arrow $V_1$. At the same time, platen 40 and semiconductor wafer 34 may be moved horizontally relative to platen 42 and flexible substrate 20 in a horizontal direction indicated $H_1$. Stated another way, flexible substrate 20 may also be moved in a horizontal direction such that the horizontal component of motion of the flexible substrate 20 is in a second direction $H_2$, opposite the first horizontal direction $H_1$. Thus, the semiconductor wafer 34 and the tip ends 30 of the leads 26 move, relative to the flexible substrate 20 and the terminal ends 28 of leads 26, along the direction indicated by $A_1$. The vertical movement typically is about 100–500 microns, and the horizontal movement is typically approximately equal to the vertical movement. During the controlled movement, the tip ends 30 of the leads 26 peel away from the first surface 22 of the flexible substrate 20. The terminal ends 28 of the lead 26 remain fixed to the flexible substrate 20. During movement of the semiconductor wafer 34 and the flexible substrate 20 away from one another, the leads 26 deform and/or bend in a vertical direction away from the flexible substrate 20 and the terminal ends 28 thereof.

When the wafer 34 is moved in the direction indicated by $A_1$, the net effect of the relative movement of the semiconductor wafer 34 and the flexible substrate 20 is to move the tip ends 30 of conductive lead 26 horizontally towards and vertically away from the terminal ends 28 of the same leads, thus forming each flexible lead 26 into a vertically extensive, curved structure as illustrated in FIG. 1D. Such a lead structure is able to flex and bend so as to compensate for movement of wafer 34 and substrate 20 relative to one another. In other embodiments, the movement of the semiconductor wafer 34 and flexible substrate 20 may not include a horizontal component, but only a vertical component. In these embodiments, the vertical movement will serve to partially straighten the leads 26. In preferred embodiments, some slack is left in the vertically extended leads 26 so as to allow for subsequent movement of wafer 34 and substrate 20 relative to one another.

Figure 1E:
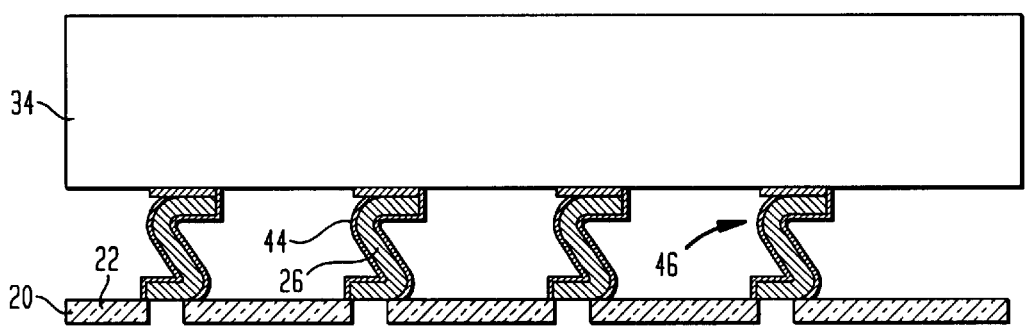

Referring to FIG. 1E, after the semiconductor wafer 34 and flexible substrate 20 have been moved away from one another so as to vertically extend leads 26, a spring-like material preferably is formed over the outer surface of leads 26. The layer of spring-like material 44 preferably has substantially higher yield strength than the material comprising the flexible lead 26. In preferred embodiments, the spring-like material 44 is selected from the group consisting of nickel, copper, cobalt, iron, tin, lead, bismuth, indium, gold, silver, platinum, tungsten, molybdenum, semi-noble metals, their alloys, and combinations thereof. The layer of spring-like material may be electroplated or may be formed by sputtering, chemical vapor deposition or combinations of any of the above methods. Although the present invention is not limited by any particular theory of operation, it is believed that the formation a layer of a spring-like material over vertically extended conductive leads 26 will substantially enhance the resiliency of the composite leads 46.

Figure 1F:
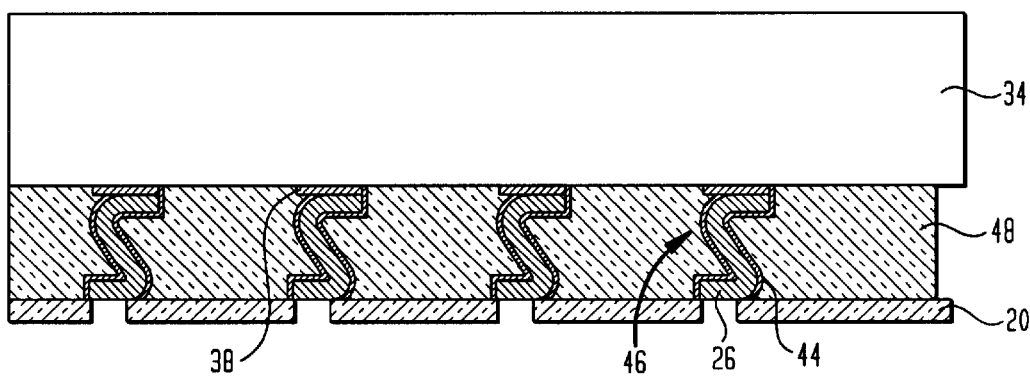

Referring to FIG. 1F, after forming the layer of a spring-like material 44 around leads 26, an encapsulant 48 such as a curable liquid material is preferably introduced between semiconductor wafer 34 and flexible substrate 20 and around composite leads 46. Preferred methods for disposing an encapsulant layer between microelectronic elements are disclosed in certain preferred embodiments of the above-mentioned U.S. Pat. No. 5,801,441. The encapsulant preferably has a low viscosity and is introduced in an uncured state. The encapsulant 48 preferably wets to the semiconductor wafer 34 and flexible substrate 20, effectively fills a gap therebetween and penetrates between composite leads 46. The encapsulant may be rigid or compliant. In preferred embodiments, the encapsulant 48 is selected so that it will form a compliant material, such as a gel or an elastomer, upon being cured. Preferred encapsulants include silicones and epoxies, with silicone elastomers and flexiblized epoxies being particularly preferred. In some embodiments, the encapsulant around the composite leads 46 is rigid and the remainder of the encapsulant between semiconductor chip or wafer 34 and flexible substrate 20 is compliant. In still other embodiments, the encapsulant around the composite leads 46 is compliant and the remainder of the encapsulant 48 between semiconductor wafer 34 and flexible substrate 20 is rigid.

In its liquid state, the encapsulant 48 may be injected under pressure. The encapsulant may also be injected without external pressure and allowed to fill the gap between semiconductor wafer 34 and flexible substrate 20 only by capillary action. After being disposed between semiconductor wafer 34 and flexible substrate 20 and around composite leads 46, the encapsulant is cured in placed. Depending upon the formulation of the encapsulant, such curing may take place spontaneously at room temperature or else may require exposure to energy, such as heat or radiant energy.

Figure 1G:
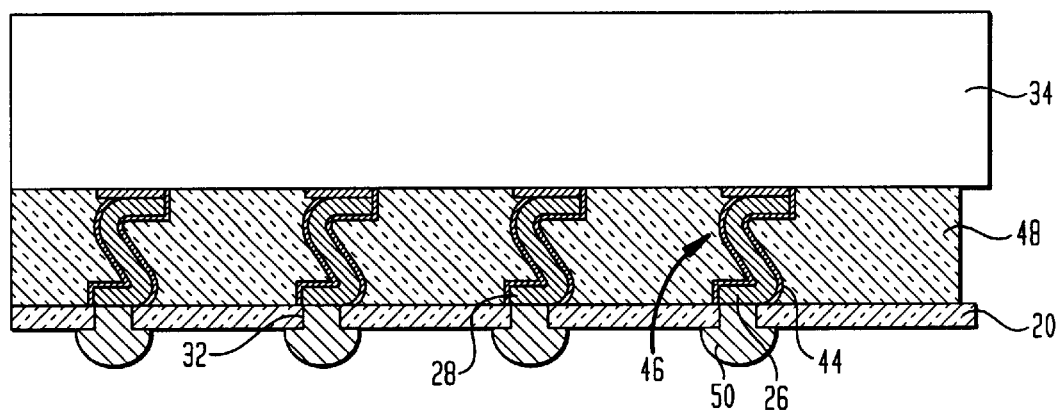

Referring to FIG. 1G, after encapsulant layer 48 has been cured to provide a compliant or resilient layer between semiconductor wafer 34 and flexible substrate 20, conductive elements 50 may by attached to the terminal ends 28 of composite leads 46. The conductive elements 50 are preferably tin/lead solder balls that extend through the openings 32 in the flexible substrate 20. The conductive elements 50 may be reflowed so as to permanently attach the conductive elements 50 to terminal ends 28 of composite leads 46. Upon being reflowed, the conductive elements 50 preferably form an intermetallic bond with the terminal ends 28 of the leads 26. Surface tension may also result in the reflowed conductive elements 50 having a substantially spherical shape. In other preferred embodiments, the conductive elements 50 may include material such as gold and platinum.

Figure 2A:
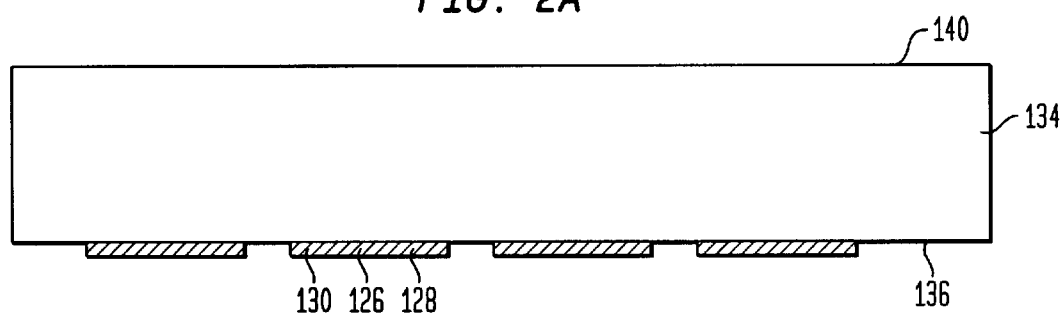

Referring to FIG. 2A, in accordance with further preferred embodiments of the present invention a first microelectronic component 134, such as a semiconductor wafer, has a first surface 136 and a second surface 140 remote therefrom. The first surface 136 of semiconductor wafer 134 has a plurality of conductive traces or leads 126 formed thereon. Each conductive lead 126 includes a first end 130 releasably attached to first face 136 and a second end 128 permanently attached to wafer 134.

Figure 2B:
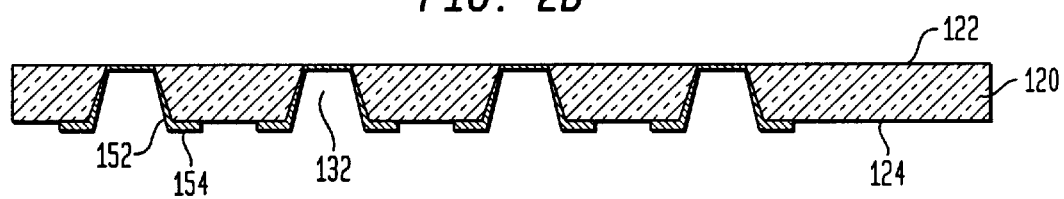

Referring to FIG. 2B, the front face 136 of wafer 134 is preferably juxtaposed with a flexible substrate 120. In a particular preferred embodiment shown in FIG. 2B, the flexible substrate 120 is a two-metal tape having a first surface 122 and a second surface 124 remote therefrom. The flexible tape 120 includes a series of vias 132 extending between the first and second surfaces 122, 124 thereof. Each via 132 preferably has a layer of a conductive metal 152 deposited therein. Each layer of conductive material 152 deposited in vias 132 preferably includes a flange region 154 that extends outwardly from the via 132 along the second surface 124 of substrate 120.

Figure 2C:
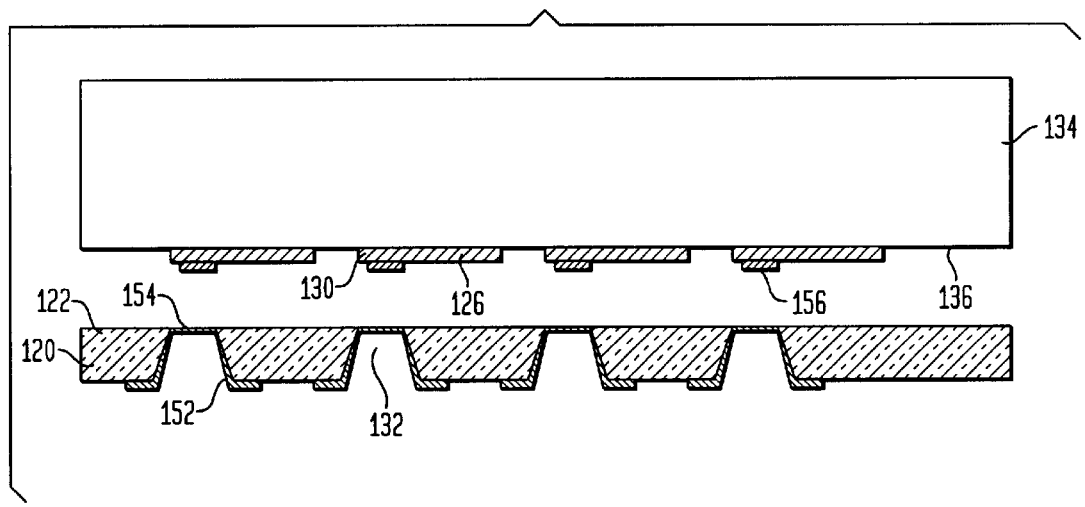
Figure 2D:
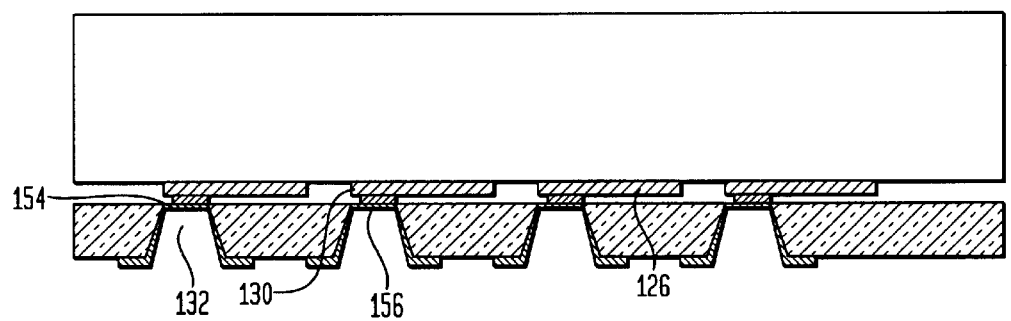

Referring to FIG. 2C, the first face 136 of semiconductor wafer 134 is juxtaposed with top surface 122 of flexible tape 120. The releasable first ends 130 of conductive leads 126 are preferably placed in substantial alignment with the conductive metal 152 deposited in the vias 132. A portion 154 of metal layer 152 is preferably accessible at the top surface 122 of flexible tape 120. The wafer 134 is moved toward the top surface 122 of flexible tape 120 until the conductive leads 126 contact the deposited metal 152 accessible at the first surface 122 of flexible tape 120. Immediately before the first ends 130 of leads 126 contact the metal portion 154, a conductive paste or adhesive 156 may be applied to the releasable ends 130 of leads 126. The conductive adhesive allows the leads to be attached to the metal portion 154. FIG. 2D, shows the releasable ends 130 of leads 126 attached to metal portion 154 of the metalized vias 132.

Figure 2E:
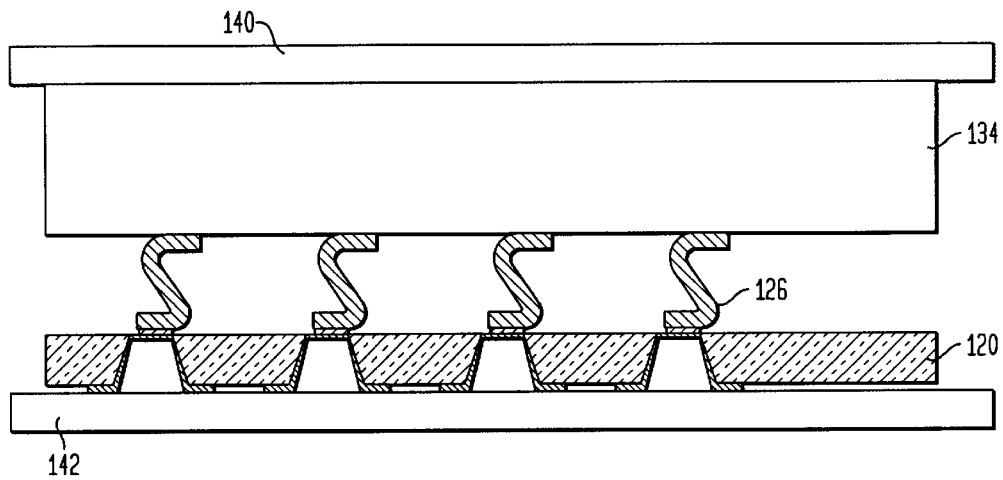

Referring to FIG. 2E, semiconductor wafer 134 and flexible tape 120 are then moved away from one another in a controlled manner using platens 140 and 142 as described above in reference to FIG. 1D. As semiconductor wafer 134 and flexible tape 120 move away from one another, conductive leads 126 are vertically extended.

Figure 2F:
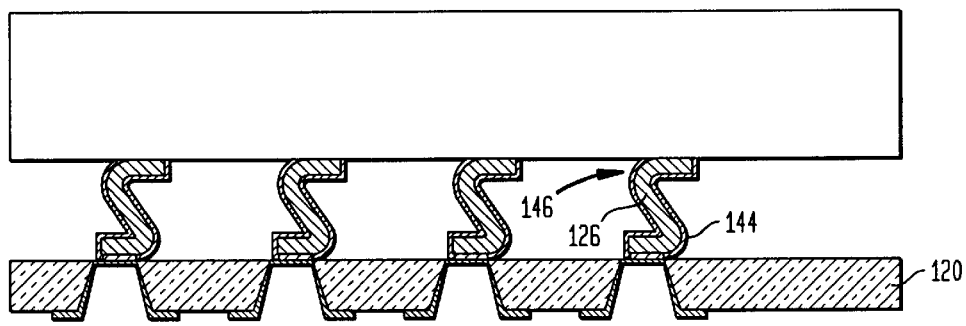

Referring to FIG. 2F, a layer of a spring-like material, such as nickel, is then formed over the exterior surface of each conductive lead 126. As mentioned above, the layer of spring-like material 144 preferably has a relatively higher yield strength than the yield strength of the conductive leads 126. Together, the conductive leads 126 with the layer of a spring-like material formed thereon comprise composite leads 146.

Figure 2G:
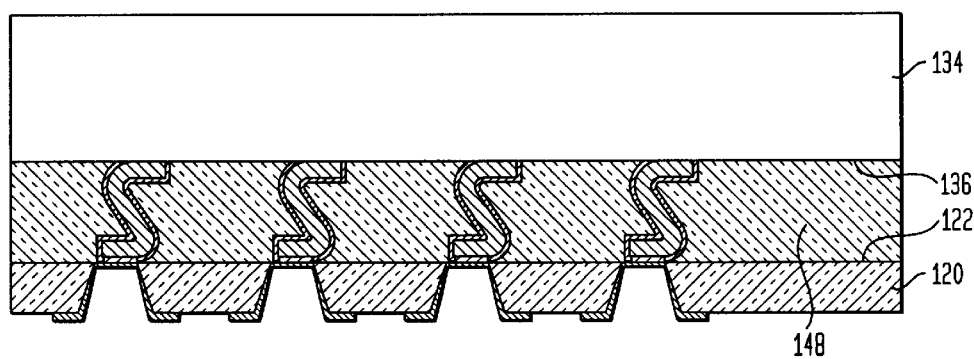

Referring to FIG. 2G, after composite leads 146 have been formed, a curable encapsulant may then be disposed between the front face 136 of semiconductor wafer 134 and the first surface 122 of flexible tape 120. As mentioned above, the curable encapsulant is preferably disposed between the wafer and tape while the curable encapsulant is in a liquid form. The encapsulant may then be cured in situ by applying energy or exposing the encapsulant to atmosphere. The cured encapsulant layer is preferably compliant so as to compensate for thermal expansion and contraction of the wafer 134 and substrate 120 during assembly and operation of the microelectronic package.

Referring to FIG. 2H, conductive elements 150 such as solder balls may be then attached to the metalized vias 132. The conductive elements are then preferably reflowed to permanent attach the conductive elements to the metalized vias. During reflow, surface tension preferably reshapes the outer surface of the conductive elements so that the conductive elements have a substantially spherical shape as shown in FIG. 2H. After conductive elements 150 have been attached, the microelectronic package of 2H may be electrically interconnected with another element via the conductive elements 150.

Referring to FIG. 2I, the microelectronic assembly of FIG. 2H may be severed to provide a plurality of microelectronic packages having an array of resilient leads. As shown in FIG. 2I, semiconductor wafer 134, encapsulant layer 148 and flexible tape 120 are severed to provide microelectronic packages 160A and 160B. Although only two microelectronic packages are shown in FIG. 2I, the wafer 134 may be severed to provide a plurality of microelectronic packages (e.g., 100–200 chip packages or more). Each microelectronic package desirable includes at least one semiconductor chip 162, a portion of flexible tape 120 and an array of resilient leads 146 that electrically interconnect chip 162 with conductive elements 150. As such, the microelectronic packages 160A, 160B may be electrically interconnected with other elements such as a test socket, a circuitized substrate or a printed circuit board. During operation of the microelectronic packages 160A and 160B, the various components will typically heat up. As the components heat up, the components may expand at different rates due to differences in coefficients of thermal expansion. However, the resilient nature of composite leads 146, encapsulant layer 148, and flexible tape 120 will allow the semiconductor chip 162 move relative to substrate 120 so as to remain electrically interconnected with conductive elements 150.

Figure 3A:
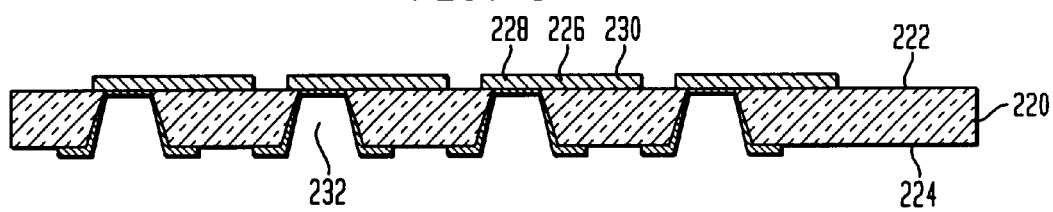
FIGS. 3A–3H show a method of making a compliant connection component having an array of resilient leads, in accordance with still further preferred embodiments of the present invention.

FIGS. 3A–3H show yet another preferred embodiment of a method of making a microelectronic package having an array of resilient leads. Referring to FIG. 3A, a substrate 220, such as a two metal flexible tape, has a first surface 222 and a second surface 224 remote therefrom. The two metal tape 220 includes a plurality of conductive leads 226 formed thereon. Each conductive leads 226 has a first end 230 releasable secured to the first surface 222 of two metal tape 220 and a second or terminal end 228 permanently fixed to two metal tape 220. The terminal end 228 of conductive leads 226 overlie through vias 232, then through vias 232 extending between the first and second surfaces 222, 224 of two metal tape 220.

Figure 3B:
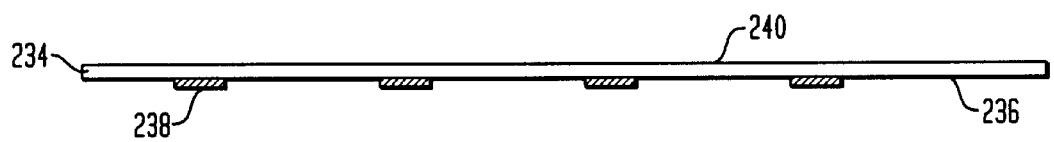
Figure 3C:
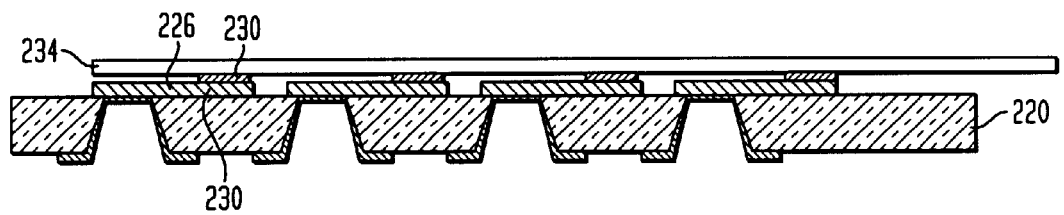

Referring to FIG. 3B, a fixture such as a sacrificial layer may then be juxtaposed with two metal tape 220. Fixture 234 includes contact bearing surface 236 having a plurality of contacts 238 formed thereon and a back surface 240 remote therefrom. Referring to FIG. 3C, fixture 234 may be juxtaposed with two metal tape 220 so that contacts 238 are in substantial alignment with the releasable ends 230 of leads 226. Contacts 230 are preferably permanently attached to releasable tip ends 230 of conductive leads 226, such as by using a bonding process or a conductive adhesive.

Figure 3D:
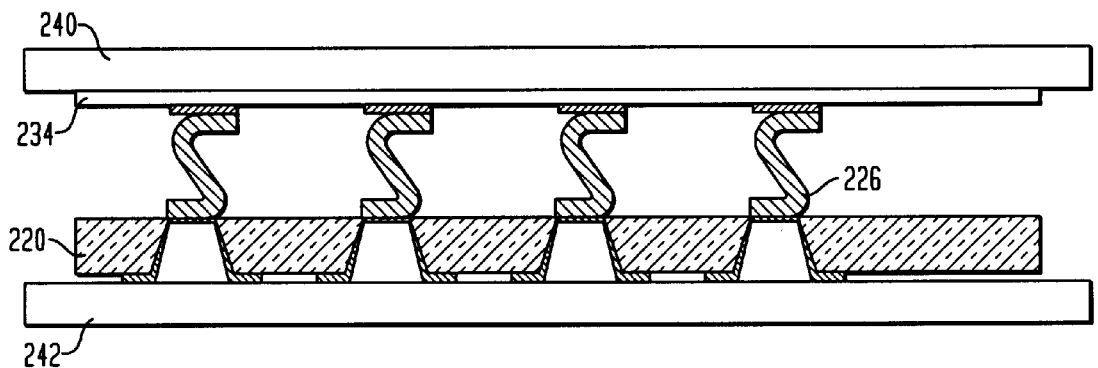

Referring to FIG. 3D, in order to move fixture 234 and tape 220 away from one another, platens 240 and 242 are preferably abutted against fixture 234 and two metal tape 220, respectively. As described above, platens 240, 242 are used to controllably move fixture 234 and two metal tape 220 away from one another in a vertical direction. Fixture 234 and substrate 220 may also be moved relative to one another in a horizontal direction. As fixture 234 and two metal tape 220 move away from one another, conductive leads 226 are extended in a substantially vertical direction.

Figure 3E:
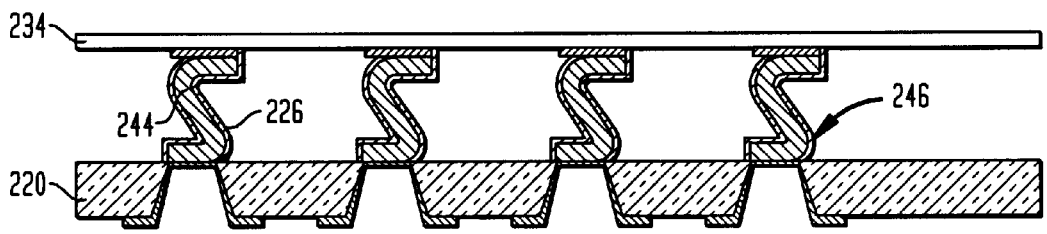

Referring to FIG. 3E, a layer of a spring-like material 244 may then be deposited over the exterior surface of conductive leads 226 to form composite leads 246. As mentioned above, the formation of a layer of a spring-like material 244 over conductive leads 226 improves the overall resilience of the final structure, i.e., composite lead 246. This improved resiliency enhances the ability of the lead to maintain an electrical interconnection between microelectronic elements during thermal cycling.

Figure 3F:
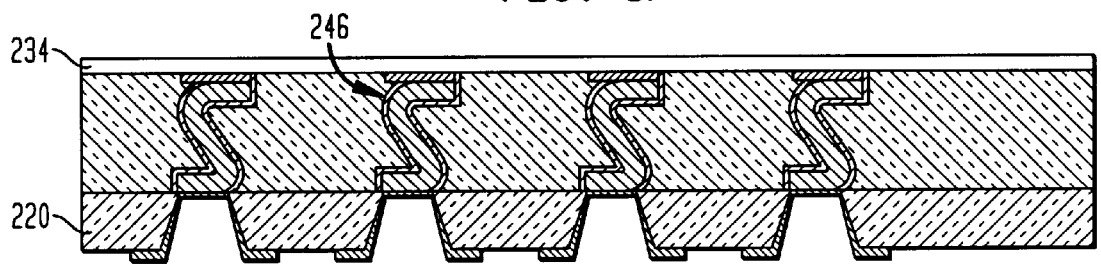

Referring to FIG. 3F, a layer of a curable liquid material 248 is then preferably deposited between fixture 234 and two metal tape 220 and around composite leads 246. In preferred embodiments, the layer of curable material 248 may then be cured to provide a compliant material that enables the composite leads 246 to flex and bend during thermal cycling.

Figure 3G:
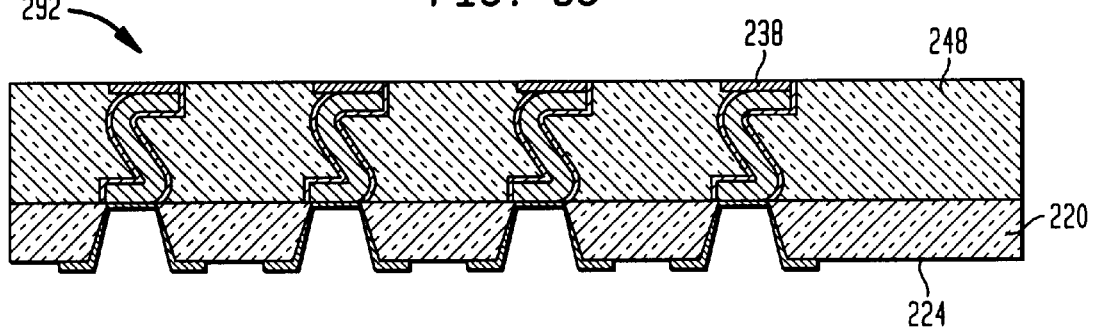

Referring to FIG. 3G, the fixture 234 may then be removed to transform the subassembly into a connection component. In certain embodiments the fixture 234 is completely removed, such as by exposing the subassembly to a chemical etchant. In other embodiments, the fixture may be comprised of a conductive material and may be provided without contacts 238. Portions of the conductive fixture may then be removed. The remaining portions form contacts in the tip ends of the leads. After fixture 234 has been removed, contacts 238 are exposed at a top surface of encapsulant layer 248. As mentioned above, the subassembly shown in FIG. 3G may be used as a compliant connection component 292 that can electrical interconnect two or more microelectronic elements. In certain embodiments, the contacts of a first microelectronic element may be connected with the contacts 238 exposed at a top surface of encapsulant layer 248. In turn, contacts of a second microelectronic element may be permanently or temporarily attached to terminals exposed at the second surface 224 of two metal tape 220.

Figure 3H:
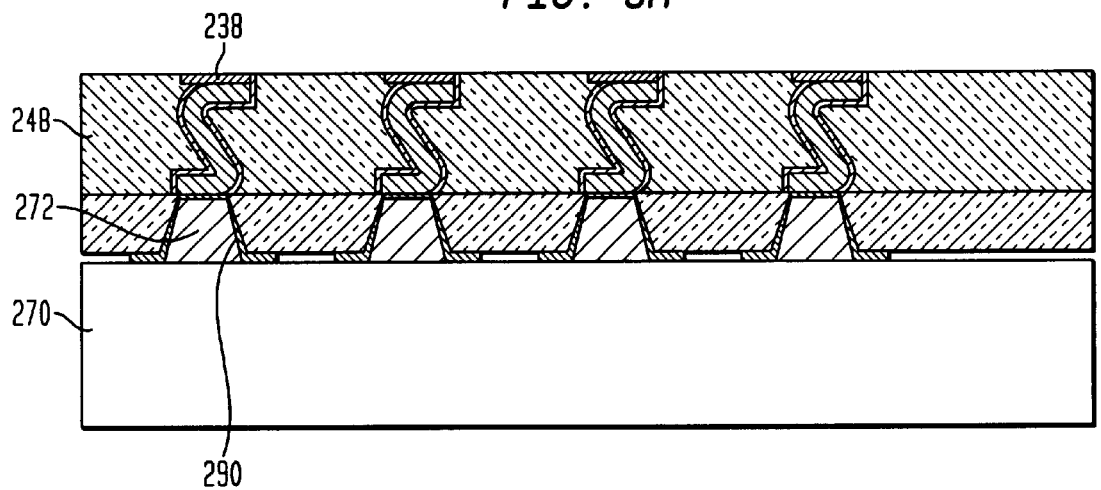

In FIG. 3H, a test fixture 270 having conductive elements 272 at a top surface thereof, is utilized to test the subassembly shown in FIG. 3G. The conductive elements 272 of the test fixture are preferably provided in a spaced array, the conductive elements 272 matching the alignment of terminals 290 of connection component 292. After connection component 292 has been positioned atop test fixture 270, a microelectronic element or other electronic element having contacts may be juxtaposed with the contacts 238 at the top of compliant layer 248, thereby allowing the connection component to be tested and evaluated. Alternatively or additionally, connection component 292 may be used to permanently connect two microelectronic elements.

Figure 4:
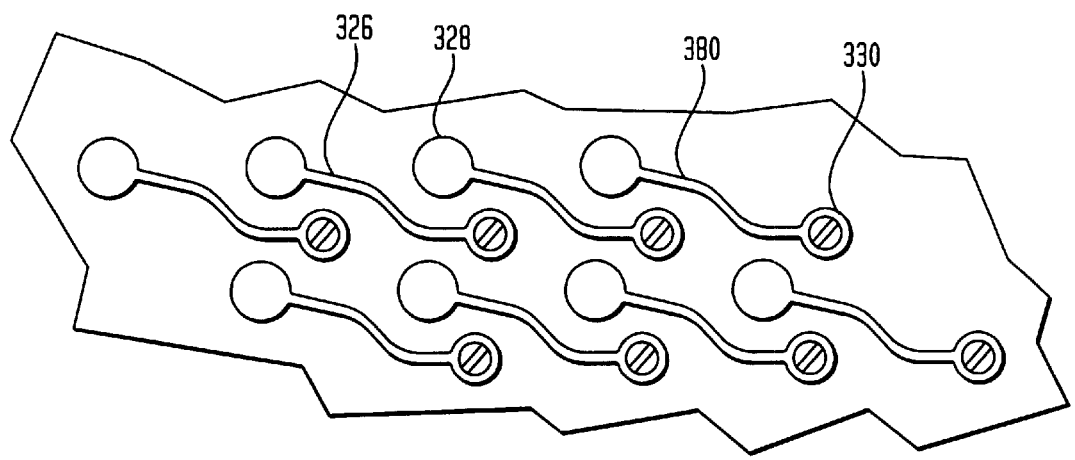
FIG. 4 shows leads having tip ends releasably attached to a substrate, in accordance with preferred embodiments of the present invention.
Figure 5:
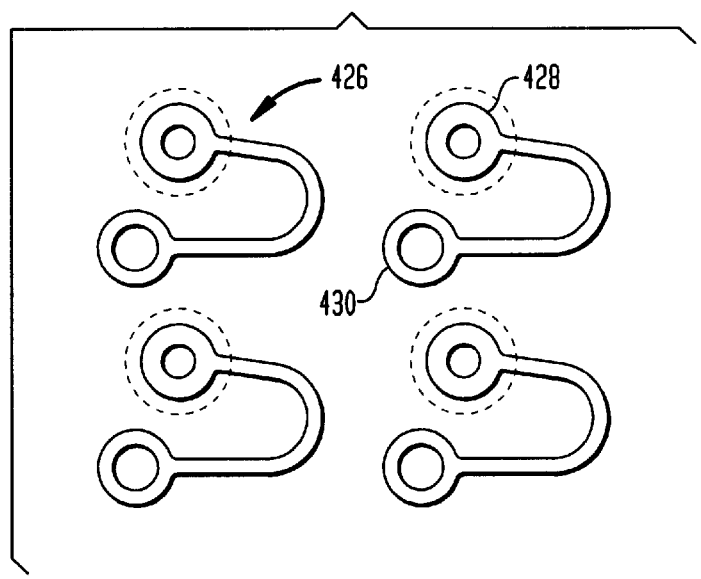
FIG. 5 shows leads having tip ends releasable attached to a substrate, in accordance with other preferred embodiments of the present invention.

Referring to FIGS. 4 and 5, the leads shown and described above may be arranged in many different ways on wafers, flexible substrates, flexible tapes and other microelectronic elements. For example, referring to FIG. 4, each lead 326 its initial undeformed state, may include an S-shaped strip 380 extending between the terminal ends 328 and tip ends 330 thereof. The S-shaped lead structures may be nested as shown in FIG. 4 with the terminal ends 328 deposed in rows and the tip ends 330 deposed in similar but offset rows. Referring to FIG. 5, the leads 426 may also be substantially U-shaped structures having a single bight between the terminal end 428 and tip end 430 of each lead. Structures with plural bights can also be employed. Such leads are shown and described in certain preferred embodiments of commonly assigned U.S. Pat. No. 5,518,964, the disclosure of which is hereby incorporated by reference herein.

Figure 6:
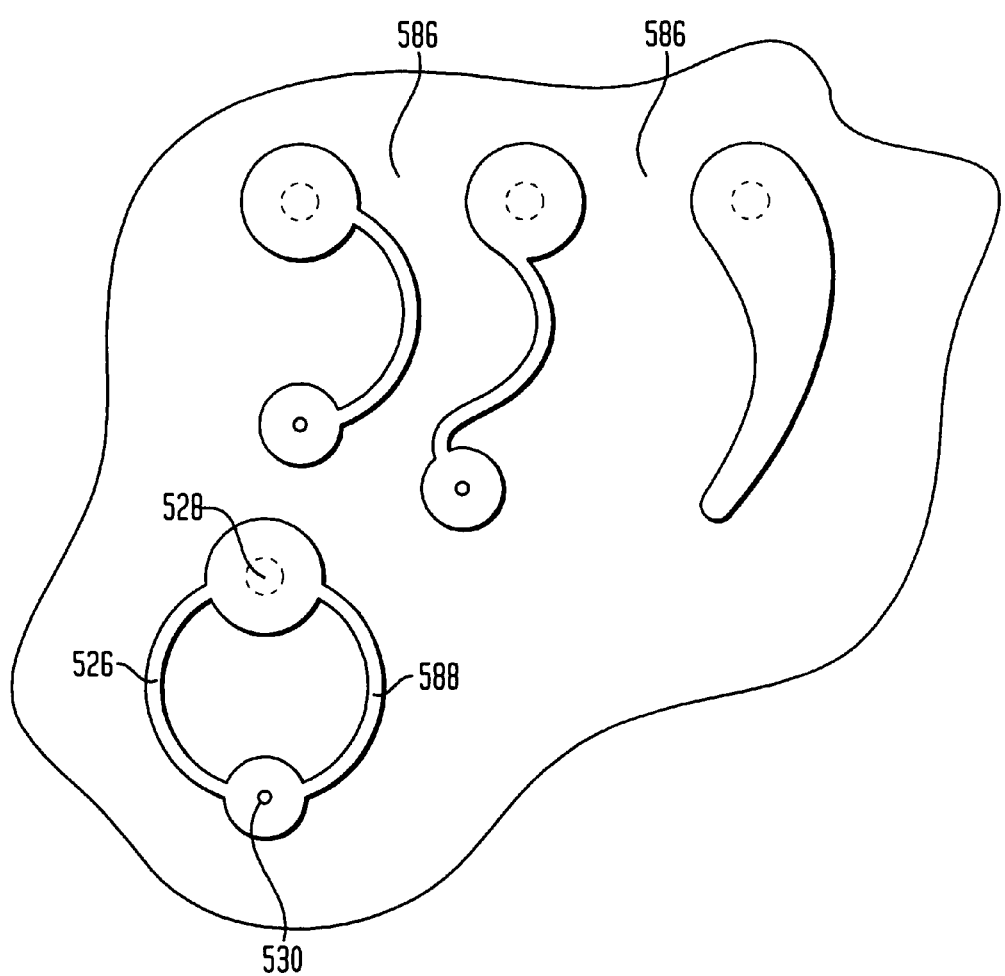
FIG. 6 shows a variety of leads formed atop a substrate, in accordance with still other preferred embodiments of the present invention.

The conductive leads may also have the various configurations shown in FIG. 6 and disclosed in the above-mentioned '964 patent, as well as in commonly assigned U.S. Pat. Nos. 5,859,472 and 6,191,368,the disclosures of which are hereby incorporated by reference herein. As a result, any gap 586 surrounding the conductive leads may have correspondingly varied shapes. In each case, the gaps extend alongside the flexible, conductive leads. Lead 526 is in the form of a closed loop 588 connecting the second end 530 of flexible lead with the first end 528 thereof. The closed loop section 588 of lead 526 encircles a central region 590.

Figure 7:
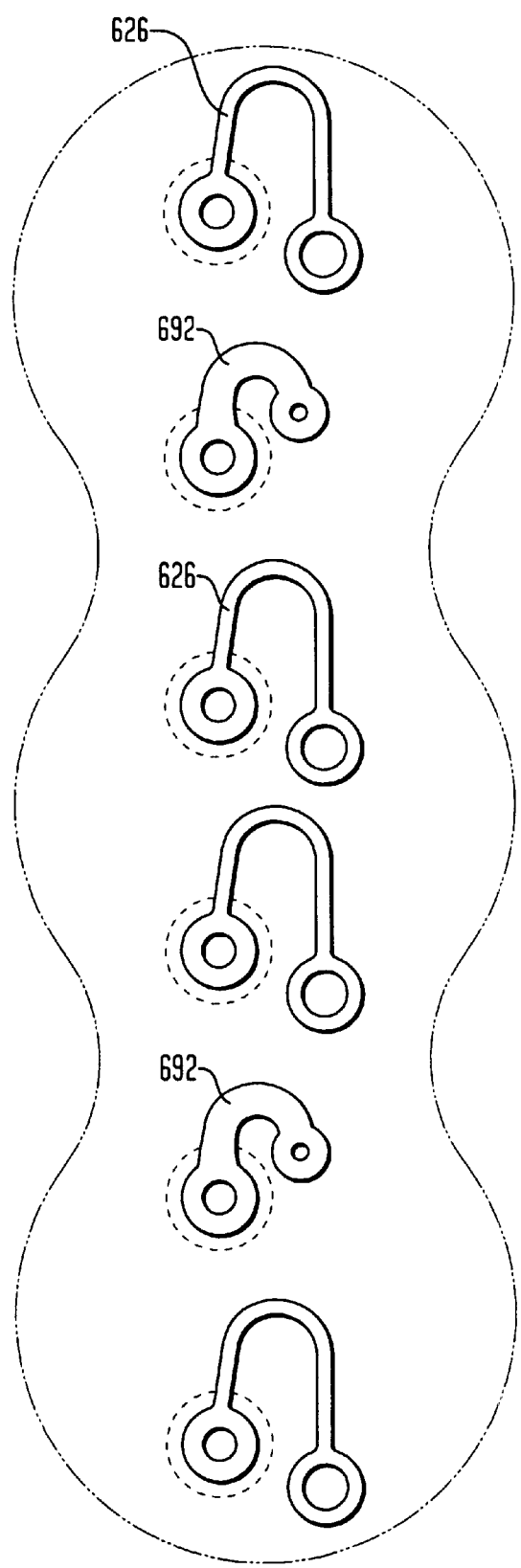
FIG. 7 shows leads shown and restraining straps formed atop a substrate, in accordance with further preferred embodiments of the present invention.

Referring to FIG. 7, in still other preferred embodiments, restraining straps 692, which are shorter and stronger than conductive leads 626, are connected between two microelectronic elements. Restraining straps 692 may be formed during the same process steps used to make the conductive leads. Such restraining straps are disclosed in commonly assigned U.S. Pat. No. 5,976,913, the disclosure of which is hereby incorporated by reference herein. After leads 626 electrically interconnect two or more microelectronic elements, restraining straps 692 limit movement of the microelectronic elements away from one another so that sufficient slack remains in the flexible, conductive leads 626.

Figure 8:
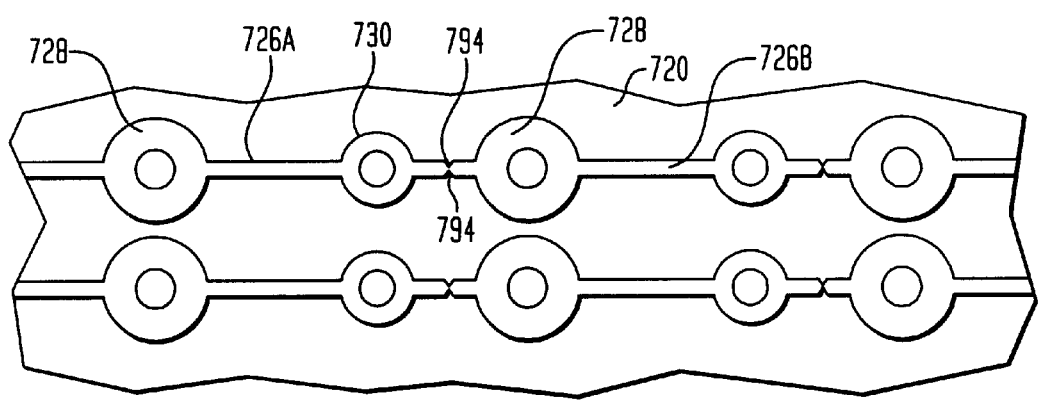
FIG. 8 shows leads formed atop a substrate, in accordance with still further preferred embodiments of the present invention.

Referring to FIG. 8, in yet further preferred embodiments, the tip end 730 of each lead 726 is connected through a frangible element 794 to the terminal end 728 of the next adjacent lead. The frangible element 794 thus retains each tip end 730 in position, adjacent a surface of a substrate 720 or semiconductor wafer. Frangible element 794 may be formed as a continuation of a strip constituting the lead itself, with V-shaped notches extending in the strip from opposite sides thereof. During the assembly process, the tip ends 730 are bonded to the contacts of a chip or other microelectronic element in the same manner as discussed above. After bonding, the microelectronic element is moved relative to the connector body or dielectric sheet in the same manner as discussed above, so that the tip end 730 of each lead 726 moves vertically away from the body and away from the terminal ends 728, and so that the tip end 720 also moves toward the associated terminal end 728. This action breaks the frangible element 794 and hence, releases each tip end from its connection to the next terminal end. Such leads are disclosed are certain preferred embodiments of the '964 patent.

Figure 9:
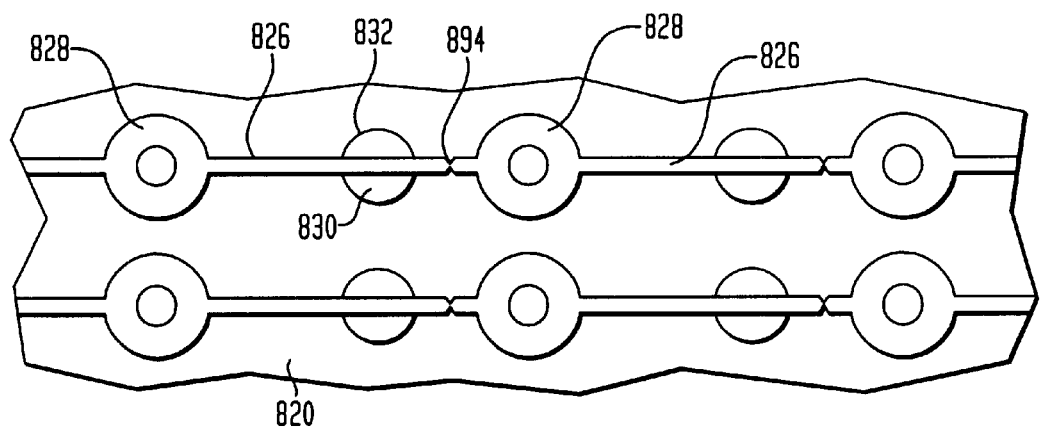
FIG. 9 shows leads formed atop a substrate in accordance with yet further preferred embodiments of the present invention.

Referring to FIG. 9, in still other preferred embodiments of the present invention, the tip ends 830 of each lead 826 is not provided with a bulge, but instead constitutes a continuation of lead 826. The tip end 830 of the lead is connected to the terminal end 828 of the next adjacent lead by a frangible section 894. In this component, the dielectric sheet or connector body 820 has holes 832 aligned with the terminal ends 828 of the leads 826. After connector body 820 and the leads 826 thereon are in alignment with contacts on a microelectronic element or chip, a tool (not shown) is advanced through holes 832 for engaging the tip ends 830 of each lead 826 in succession so as to bond a tip ends 830 to contact. After such bonding, the microelectronic elements or chip may be moved relative to the connector body in the same manner as discussed above. Once again, this movement breaks the frangible section 894 between the tip end of each lead and terminal end 828 of the adjacent lead, thus releasing the tip ends 830 and allowing the leads to bend away from the connector body. Before or after the movement step, holes 832 may be closed by application of a further film or sheet on the top surface of the dielectric layer.

Although the present invention has been described with reference to particular preferred embodiments, it is to be understood that the embodiments are merely illustrative of the principle and application of the present invention. It is therefor to be understood that numerous modifications may be made to the preferred embodiments and that other arrangements may be devised without departing from the spirit and scope of the present invention as defined by the claims.

What is claimed is:

1. A method of making a microelectronic package having an array of resilient leads comprising:

providing a first element having a plurality of conductive leads at a first surface thereof, said conductive leads having terminal ends permanently attached to said first element and tip ends remote from the terminal ends, the tip ends of said conductive leads being movable relative to said terminal ends;

providing a second element having a plurality of contacts on a first surface thereof and juxtaposing the first surface of said second element with the first surface of said first element;

connecting the tip ends of said conductive leads with the contacts of said second element;

moving said first and second elements away from one another so as to vertically extend said conductive leads between said first and second elements; and after the moving step, forming a layer of a spring-like material over said conductive leads.

2. The method as claimed in claim 1, wherein said conductive leads are made of a material selected from the group consisting of aluminum, gold, copper, tin, their alloys, and combinations thereof.

3. The method as claimed in claim 1, wherein said layer of spring-like material is selected from the group consisting of nickel, copper, cobalt, iron, gold, silver, platinum, noble metals, semi-noble metals, tungsten, molybdenum, tin, leads, bismuth, indium, their alloys, and combinations thereof.

4. The method as claimed in claim 3, wherein said layer of a spring-like material is selected from the group consisting of nickel and nickel alloys.

5. The method as claimed in claim 1, wherein the layer of a spring-like material has a greater yield strength than said conductive leads.

6. The method as claimed in claim 1, further comprising depositing a curable liquid encapsulant between said first and second elements and around said vertically extended leads.

7. The method as claimed in claim 6, further comprising curing said encapsulant to provide a compliant layer between said first and second elements.

8. The method as claimed in claim 6, wherein said curable liquid encapsulant is selected from the group consisting of elastomers and adhesives.

9. The method as claimed in claim 6, wherein said curable liquid encapsulant is curable to a silicone elastomer.

10. The method as claimed in claim 1, wherein said terminals are accessible at the second surface of said second element.

11. The method as claimed in claim 10, further comprising attaching conductive elements to the terminal ends of said leads.

12. The method as claimed in claim 10, wherein said conductive elements comprise solder balls.

13. The method as claimed in claim 1, wherein said first and second elements are selected from the group consisting of a semiconductor chip, a semiconductor wafer, and a flexible circuitized substrate.

14. The method as claimed in claim 13, wherein said first element is a semiconductor chip or wafer and the second element is a flexible circuitized substrate.

15. The method as claimed in claim 13, wherein said second element is a semiconductor chip or wafer and the first element is a flexible circuitized substrate.

16. The method as claimed in claim 1, wherein at least one of said first and second elements is a sacrificial layer.

17. The method as claimed in claim 16, further comprising removing at least a portion of said first element so as to expose the terminal ends of said conductive leads.

18. The method as claimed in claim 17, wherein the first element is a first microelectronic element and the second element is a second microelectronic element.

19. The method as claimed in claim 16, further comprising removing at least a portion of said second element so as to expose the contacts connected to the tip ends of said conductive leads.

20. The method as claimed in claim 1, wherein said first element is a first microelectronic element and said second element is a second microelectronic element.

21. A method of making a microelectronic package having a plurality of resilient leads comprising:

providing a first element having conductive leads extending along a first surface thereof, said conductive leads having terminal ends permanently attached to said first element and tip ends releasably secured to said first element;

providing a second element having contacts on a first surface thereof and juxtaposing the first surface of said second element with the first surface of said first element;

connecting the tip ends of said conductive leads with the contacts of said second element;

moving said first and second elements away from one another so as to vertically extend said conductive leads between said first and second elements; and after the moving step, forming a layer of a spring-like material over said conductive leads.

22. The method as claimed in claim 21, wherein the forming a layer of a spring-like material step includes plating a conductive metal over said conductive leads.

23. The method as claimed in claim 21, wherein said layer of a spring-like material has a greater yield strength than said conductive leads.

24. The method as claimed in claim 21, wherein the first element is a first microelectronic element and the second element is a second microelectronic element.

25. The method as claimed in claim 21, further comprising:

disposing a curable liquid encapsulant between said first and second microelectronic elements and around said conductive leads; and curing said curable liquid encapsulant to form a compliant layer between said first and second microelectronic elements.

26. The method as claimed in claim 25, wherein said encapsulant is selected from the group consisting on elastomers and adhesives.

27. The method as claimed in claim 21, wherein said first microelectronic element is a flexible substrate and said second microelectronic element includes a semiconductor chip.

28. The method as claimed in claim 21, further comprising attaching conductive elements to the terminal ends of said leads, wherein said conductive elements are accessible at a second surface of said first element.

29. The method as claimed in claim 21, wherein the terminal ends of said conductive leads extend between the first surface and a second surface of said first microelectronic element.

30. A method of making a microelectronic package comprising:

providing a first element having a first surface with a plurality of conductive leads formed thereon, each said lead having a first end permanently attached to said first element and a second end movable away from said first element;

providing a second element having conductive pads accessible at a first surface thereof and juxtaposing the first surface of said first element with the first surface of said second element;

attaching the tip ends of said conductive leads with said conductive pads of said second element;

after the attaching step, moving said first and second elements away from one another so as to vertically extend said conductive leads; and after the moving step, forming a layer of a conductive metal over said conductive leads, wherein said layer of a conductive metal has a greater yield strength than said conductive leads.

31. The method as claimed in claim 30, wherein the attaching said tip ends step includes bonding the tip ends of said leads to said conductive pads so as to electrically interconnect said leads and said conductive pads.

32. The method as claimed in claim 30, further comprising after the forming a layer of a conductive material step, providing a curable liquid encapsulant between said microelectronic elements and around said conductive leads and curing said encapsulant to provide a compliant layer.

33. The method as claimed in claim 32, wherein said first microelectronic element is a semiconductor wafer and said second microelectronic element is a flexible dielectric sheet.

34. The method as claimed in claim 33, further comprising severing said semiconductor wafer and said flexible dielectric sheet to provide a plurality of semiconductor packages, each said package including at least one semiconductor chip.

35. The method as claimed in claim 33, wherein the conductive pads of said second microelectronic element are accessible at the first surface and a second surface of said second microelectronic element, the method further comprising attaching conductive elements to the conductive pads of said second microelectronic element, said conductive elements overlying the second surface of said second microelectronic element.

36. A method of making semiconductor packages having resilient leads comprising:

providing a first microelectronic element selected from the group consisting of semiconductor chips and semiconductor wafers, wherein said first microelectronic element has a plurality of contacts on a first surface thereof;

providing a flexible dielectric sheet having a plurality of conductive leads over a first surface thereof, each said lead having a terminal end permanently attached to said flexible dielectric sheet and a tip end movable away from the first surface of said dielectric sheet;

electrically interconnecting the tip ends of said leads to the contacts of said first microelectronic element;

moving said first microelectronic element and dielectric sheet away from one another so as to vertically extend said leads;

after the moving step, forming a layer of a spring-like material over said leads, wherein the spring-like material has a greater yield strength than the conductive leads.

37. The method as claimed in claim 36, further comprising providing a layer of a compliant material between said first microelectronic element and said dielectric sheet and around said leads.

38. The method as claimed in claim 37, further comprising after the providing a layer of a compliant material step, severing said first microelectronic element and said dielectric sheet to provide a plurality of semiconductor packages, each said semiconductor package comprising at least one semiconductor chip and a portion of said dielectric sheet.

39. A method of making a microelectronic element comprising:

providing a dielectric sheet having a plurality of conductive leads overlying a first surface of said sheet and a plurality of terminals accessible at a second surface of said sheet, each said lead having a first end permanently attached to one of said terminals and a second end movable away from the first surface of said dielectric sheet;

providing a fixture having a first surface and a plurality of contacts accessible at the first surface of said fixture;

juxtaposing the first surface of said fixture with the first surface of said dielectric sheet and attaching the second ends of said leads with the contacts of said fixture;

after the attaching step, moving said fixture and said dielectric sheet away from one another so as to vertically extend said leads;

forming a layer of a conductive spring-like material over said leads;

providing a layer of a curable liquid encapsulant between said fixture and said dielectric sheet and around said leads and curing said encapsulant to form a compliant layer; and after the curing step, removing said fixture so as to expose said contacts at a top surface of said package.

40. The method as claimed in claim 39, further comprising temporarily connecting said contacts at the top surface of said package with the contacts of an element.

41. The method as claimed in claim 40, wherein said microelectronic element is a test fixture.

42. The method as claimed in claim 39, further comprising temporarily connecting the terminals of said dielectric sheet with the contacts of an element.

43. The method as claimed in claim 42, wherein said microelectronic element is a test fixture.

* * * * *